(12) United States Patent
Chen et al.

(10) Patent No.: US 9,385,136 B2
(45) Date of Patent: Jul. 5, 2016

(54) SILICON DOT FORMATION BY SELF-ASSEMBLY METHOD AND SELECTIVE SILICON GROWTH FOR FLASH MEMORY

(71) Applicant: Taiwan Semiconductor Manufacturing Co., Ltd., Hsin-Chu (TW)

(72) Inventors: Chih-Ming Chen, Hsinchu (TW); Tsung-Yu Chen, Hsinchu (TW); Cheng-Te Lee, Chupei (TW); Szu-Yu Wang, Hsinchu (TW); Chung-Yi Yu, Hsin-Chu (TW); Chia-Shiung Tsai, Hsin-Chu (TW); Xiaomeng Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/745,568

(22) Filed: Jun. 22, 2015

(65) Prior Publication Data
US 2015/0287737 A1    Oct. 8, 2015

Related U.S. Application Data

(62) Division of application No. 13/974,137, filed on Aug. 23, 2013, now Pat. No. 9,064,821.

(51) Int. Cl.
*H01L 29/788*   (2006.01)
*H01L 27/115*   (2006.01)
(Continued)

(52) U.S. Cl.
CPC .... *H01L 27/11568* (2013.01); *H01L 21/02118* (2013.01); *H01L 21/28273* (2013.01); *H01L 21/3086* (2013.01); *H01L 21/31144* (2013.01); *H01L 21/32* (2013.01);
(Continued)

(58) Field of Classification Search
USPC .......................................... 438/962
See application file for complete search history.

(56) References Cited

U.S. PATENT DOCUMENTS 7,045,851 B2    5/2006    Black et al.
7,189,435 B2    3/2007    Tuominen et al.
(Continued)

OTHER PUBLICATIONS

Non Final Office Action Dated Apr. 3, 2015 U.S. Appl. No. 13/974,155.

(Continued)

*Primary Examiner* — Stephen W Smoot
(74) *Attorney, Agent, or Firm* — Eschweiler & Associates, LLC

(57) ABSTRACT

Some embodiments of the present disclosure relate to a method that achieves a substantially uniform pattern of discrete storage elements within a memory cell. A copolymer solution having first and second polymer species is spin-coated onto a surface of a substrate and subjected to self-assembly into a phase-separated material having a regular pattern of micro-domains of the second polymer species within a polymer matrix having the first polymer species. The second polymer species is then removed resulting with a pattern of holes within the polymer matrix. An etch is then performed through the holes utilizing the polymer matrix as a hard-mask to form a substantially identical pattern of holes in a dielectric layer disposed over a seed layer disposed over the substrate surface. Epitaxial deposition onto the seed layer then utilized to grow a substantially uniform pattern of discrete storage elements within the dielectric layer.

20 Claims, 10 Drawing Sheets

(51) Int. Cl.

| | | |
|---|---|---|
| *H01L 21/32* | (2006.01) | |
| *H01L 21/28* | (2006.01) | |
| *H01L 29/66* | (2006.01) | |
| *H01L 21/8239* | (2006.01) | |
| *H01L 21/3213* | (2006.01) | |
| *H01L 21/3205* | (2006.01) | |
| *H01L 21/02* | (2006.01) | |
| *H01L 29/423* | (2006.01) | |
| *H01L 21/308* | (2006.01) | |
| *H01L 21/311* | (2006.01) | |
| *H01L 29/06* | (2006.01) | |
| *H01L 29/51* | (2006.01) | |
| *H01L 29/792* | (2006.01) | |

(52) U.S. Cl.
CPC ... *H01L 21/32055* (2013.01); *H01L 21/32139* (2013.01); *H01L 21/8239* (2013.01); *H01L 27/11521* (2013.01); *H01L 27/11565* (2013.01); *H01L 29/0665* (2013.01); *H01L 29/0692* (2013.01); *H01L 29/42332* (2013.01); *H01L 29/42344* (2013.01); *H01L 29/42348* (2013.01); *H01L 29/51* (2013.01); *H01L 29/66825* (2013.01); *H01L 29/788* (2013.01); *H01L 29/792* (2013.01); *Y10S 977/774* (2013.01)

(56) References Cited

U.S. PATENT DOCUMENTS

| | | |
|---|---|---|
| 7,190,049 B2 | 3/2007 | Tuominen et al. |
| 7,241,695 B2 * | 7/2007 | Mathew ............... B82Y 10/00 257/E21.209 |
| 7,407,554 B2 | 8/2008 | Colburn et al. |
| 7,416,945 B1 | 8/2008 | Muralidhar et al. |
| 7,572,669 B2 | 8/2009 | Tuominen et al. |
| 7,579,278 B2 | 8/2009 | Sandhu |
| 7,645,694 B2 | 1/2010 | Colburn et al. |
| 7,723,009 B2 | 5/2010 | Sandhu et al. |
| 7,795,607 B2 | 9/2010 | Min et al. |
| 7,808,020 B2 | 10/2010 | Doris et al. |
| 7,898,850 B2 | 3/2011 | Min et al. |
| 7,932,189 B2 | 4/2011 | Merchant et al. |
| 7,985,686 B2 | 7/2011 | Black et al. |
| 8,105,960 B2 | 1/2012 | Doris et al. |
| 8,114,468 B2 | 2/2012 | Sandhu et al. |
| 8,114,573 B2 | 2/2012 | Sandhu et al. |
| 8,133,341 B2 | 3/2012 | Nealey et al. |
| 8,133,534 B2 | 3/2012 | Stoykovich et al. |
| 8,168,284 B2 | 5/2012 | Nealey et al. |
| 8,228,743 B2 | 7/2012 | Min et al. |
| 8,247,292 B2 | 8/2012 | Black et al. |
| 8,273,665 B2 | 9/2012 | Black et al. |
| 8,287,957 B2 | 10/2012 | Nealey et al. |
| 8,299,455 B2 | 10/2012 | Doris et al. |
| 8,394,483 B2 | 3/2013 | Millward |
| 8,404,124 B2 | 3/2013 | Millward et al. |
| 8,501,304 B2 | 8/2013 | Stoykovich et al. |
| 8,512,846 B2 | 8/2013 | Millward |
| 8,513,359 B2 | 8/2013 | Millward |
| 8,518,837 B2 | 8/2013 | Russell et al. |
| 8,592,940 B2 | 11/2013 | Sandhu et al. |
| 8,609,221 B2 | 12/2013 | Millward et al. |
| 8,618,000 B2 | 12/2013 | Raghu et al. |
| 8,623,493 B2 | 1/2014 | Nealey et al. |
| 8,637,113 B2 | 1/2014 | Sandhu et al. |
| 8,673,541 B2 | 3/2014 | Xiao et al. |
| 8,685,809 B2 | 4/2014 | Doris et al. |
| 8,785,559 B2 | 7/2014 | Millward |
| 8,802,482 B2 | 8/2014 | Guo et al. |
| 8,834,956 B2 | 9/2014 | Sills et al. |
| 8,987,138 B2 | 3/2015 | Black et al. |
| 2006/0189104 A1 | 8/2006 | Yan |
| 2008/0156369 A1 | 7/2008 | Ko et al. |
| 2009/0075002 A1 | 3/2009 | Kim et al. |
| 2009/0087664 A1 | 4/2009 | Nealey et al. |
| 2009/0239334 A1 | 9/2009 | Breitwisch et al. |
| 2010/0112308 A1 | 5/2010 | Russell et al. |
| 2011/0256705 A1 * | 10/2011 | Kang .................... B82Y 10/00 438/591 |
| 2012/0202017 A1 | 8/2012 | Nealey et al. |
| 2012/0217565 A1 * | 8/2012 | Gay .................. H01L 21/28273 257/315 |
| 2013/0209757 A1 | 8/2013 | Willson et al. |
| 2013/0230705 A1 | 9/2013 | Nealey et al. |
| 2014/0042627 A1 | 2/2014 | Edelstein et al. |
| 2014/0060736 A1 | 3/2014 | Millward et al. |
| 2014/0072830 A1 | 3/2014 | Lille et al. |
| 2014/0097520 A1 | 4/2014 | Millward |
| 2014/0205818 A1 | 7/2014 | Schwartz et al. |
| 2014/0329389 A1 | 11/2014 | Matus et al. |
| 2014/0349486 A1 | 11/2014 | Sills et al. |
| 2015/0050794 A1 | 2/2015 | Kim et al. |
| 2015/0054055 A1 | 2/2015 | Chen et al. |
| 2015/0054059 A1 | 2/2015 | Chen et al. |
| 2015/0064915 A1 | 3/2015 | Wuister |

OTHER PUBLICATIONS

Sungwook Jung, et al.; "Fabrication of Needle-Like Nanostructures Using Block Copolymer for Non-Volatile Memory"; Materials Science and Engineering; www.elsevier.com/locate/msec; C27, 2007, p. 1452-1455.

R. Tiron, et al.; "Pattern Density Multiplication by Direct Self Assembly of Block Copolymers: Towards 300mm CMOS Requirements"; Proc. SPIE 8323, Alternative Lithographic Technologies IV, 83230O, Mar. 1, 2012.

Hiroshi Yoshida, et al.; "Improved Lithography by Directed Self-Assembly of Ultra-High-Density Patterns"; SPIE Newsroom, Feb. 7, 2013, p. 1-4.

Takeshi Okino, et al.; "Evaluation of Ordering of Directed Self-Assembly of Block Copolymers with Pre-Patterned Guides for bit Patterned Media"; Proc. SPIE 8223, Alternative Lithographic Technologies IV, 83230S, Mar. 1, 2012.

U.S. Appl. No. 13/974,155, filed Aug. 23, 2013.

Notice of Allowance Dated Feb. 25, 2015 for U.S. Appl. No. 13/974,137.

Final Office Action Dated Aug. 21, 2015 U.S. Appl. No. 13/974,155.

* cited by examiner

400A

400B

400C

US 9,385,136 B2

SILICON DOT FORMATION BY SELF-ASSEMBLY METHOD AND SELECTIVE SILICON GROWTH FOR FLASH MEMORY

REFERENCE TO RELATED APPLICATION

This application is a divisional of U.S. application Ser. No. 13/974,137 filed on Aug. 23, 2013, and issued as U.S. Pat. No. 9,064,821, the contents of which are incorporated by reference in their entirety.

BACKGROUND

The following disclosure relates to non-volatile memory (NVM), and more specifically memory cells which utilize a layer of discontinuous storage elements (DSEs) to store charge. Scaling of memory density within such memory cells is dependent upon scaling of the DSEs beyond the resolution limit of optical lithography. Memory device characteristics such as retention and threshold voltage ($V_{TH}$) rely upon uniformity in dimension and spatial distribution of the DSEs.

DETAILED DESCRIPTION

Figure 1A:
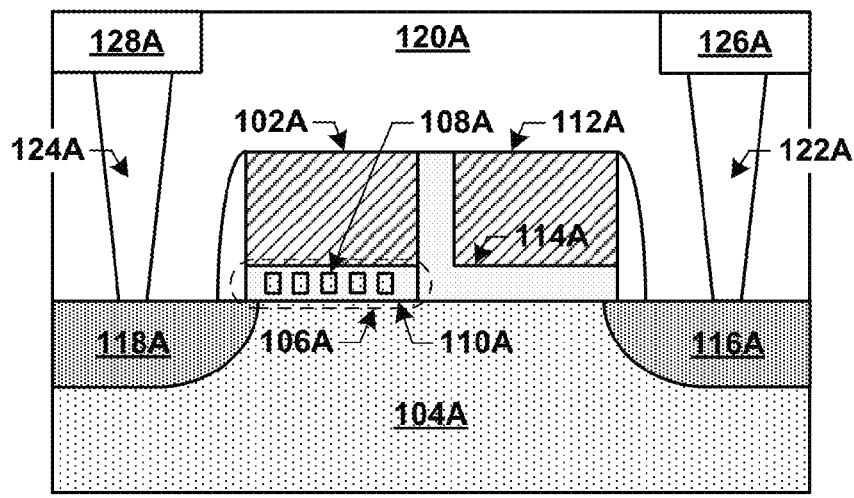
FIGS. 1A-1B illustrate a cross-sectional view of some embodiments of a split-gate thin-film storage (SG-TFS) memory cell and top-down view of a pattern of DSEs within a charge-trapping stack the SG-TFS memory cell.

The description herein is made with reference to the drawings, where like reference numerals are generally utilized to refer to like elements throughout, and where the various structures are not necessarily drawn to scale. In the following description, for purposes of explanation, numerous specific details are set forth in order to facilitate understanding. It is evident, however, that one or more aspects described herein may be practiced with a lesser degree of these specific details. In other instances, known structures and devices are shown in block diagram form to facilitate understanding.

The present disclosure may repeat reference numerals and/or letters in the various examples. This repetition is for the purpose of simplicity and clarity and does not in itself dictate a relationship between the various embodiments and/or configurations discussed. Moreover, the formation of a first feature on a second feature in the description that follows may include embodiments in which the first and second features are formed in direct contact, and may also include embodiments in which additional features may be formed interposing the first and second features, such that the first and second features may not be in direct contact. As an example, a feature formed on a substrate may include features formed on, above, and/or within the substrate.

A split-gate thin-film storage (SG-TFS) memory for embedded non-volatile memory (NVM) in advanced technology nodes comprises a charge-trapping stack of DSEs. The threshold voltage of the SG-TFS memory cell is determined in part by the uniformity of the DSEs. Some prior art methods utilize DSEs comprising embedded Si nanocrystals (Si-NCs) within a charge-trapping layer. The DSEs may be deposited by an epitaxial growth technique. In some embodiments, a substantially continuous layer of amorphous silicon is deposited by low-pressure chemical vapor deposition (LPCVD) and then exposed to heat, which causes the layer to "ball up" to form the Si-NCs. Other embodiments may use other processing conditions to disassociate the substantially continuous layer into DSEs comprising Si-NCs.

Some epitaxial growth techniques such as LPCVD result in a Gaussian distribution of deposited layer thickness across the surface of the substrate, resulting in a non-uniform distribution of Si-NCs size and space within the charge-trapping layer after the layer disassociates. Variation in Si-NCs size and space drives variable charge storage characteristics between the DSEs, which in turn can drive a non-uniform $V_{TH}$ and degrade device retention. These factors can impact performance and reduce yield for integrated circuits (ICs) utilizing such devices.

Accordingly, the present disclosure relates a method that achieves a substantially uniform pattern of DSEs within a charge-trapping layer of a memory cell. A copolymer solution comprising first and second polymer species is spin-coated onto a surface of a substrate and subjected to self-assembly into a phase-separated material, comprising a regular pattern of micro-domains of the second polymer species within a polymer matrix comprising the first polymer species. The second polymer species is then removed resulting with a pattern of holes within the polymer matrix, which may be used as a hard-mask (HM) to pattern the substrate with DSEs. An etch is then performed through the holes of the HM to form a substantially identical pattern of holes in a dielectric layer disposed over a seed layer disposed over the substrate surface. Epitaxial deposition onto the seed layer then utilized to grow a substantially uniform pattern of DSEs within the dielectric layer.

The embodiments of the present disclosure provide for a means to continuously scale the cell size of SG-TFS embedded flash memories while achieving a substantially uniform pattern of DSEs. In some embodiments, the methods described herein provide for DSEs within a hexagonal close-packed (HCP) spatial geometry comprising an DSE diameter and HCP minimum space of less than 40 nm, below the lower limit of some prior art optical lithography techniques.

FIG. 1A illustrates a cross-sectional view of some embodiments of an SG-TFS memory cell 100A formed in accordance with the embodiments of the present disclosure. The SG-TFS memory cell 100A comprises a control gate (CG) electrode 102A disposed over a surface of a substrate 104A, and separated from the surface by a charge-trapping stack 106A comprising a plurality discrete storage elements (DSEs) 108A of substrate material disposed within a dielectric material 110A. The SG-TFS memory cell 100A also comprises a select gate (SG) electrode 112A disposed over the surface of the substrate 194A, laterally adjacent the control gate electrode, and separated from the CG electrode 102A and surface by a layer of the dielectric material 114A. In some embodiments, the CG or SG electrode 102A, 112A comprises polysilicon. In some embodiments, the dielectric material 114A comprises silicon dioxide ($SiO_2$).

The CG electrode 102A and the SG electrode 112A reside between a source 116A and drain 118A of the SG-TFS memory cell 100A, which are defined by doped regions of the substrate 104A. In some embodiments, the substrate 104A comprises silicon (Si) or silicon-on-insulator (SOI). Alternatively, the substrate 102 may comprise another elementary semiconductor. In some embodiments, the source 116A and drain 118A are formed through an ion implantation technique, in which ionized dopant particles (e.g., phosphors, arsenic, antimony, etc.) are accelerated in an electrical field and impacted on the surface of the substrate 104A. An interlayer dielectric (ILD) 120A is formed over the memory cell, and trenches are formed in the ILD 120A and filled with a conductive material to form first and second contacts 122A, 124A from the source and drain 116A, 118A to first and second wiring levels 126A, 128A, respectively.

In some embodiments, programming of the SG-TFS memory cell 100A comprises storing charge within DSEs 108A located on a drain-side (left side) of the charge-trapping stack 106A though hot carrier injection (HCI), by applying appropriate voltages to the CG and SG electrodes 102A, 112A, as well as the drain 118A. As current flows within a channel region of the SG-TFS memory cell 100A in response to these applied voltages, hot carriers are injected from a channel of the device into the drain-side of the charge-trapping stack 106A. In some embodiments, programming of the SG-TFS memory cell 100A comprises storing charge within DSEs 108A located on a source-side (right side) of the charge-trapping stack 106A though source side injection (SSI) through HCI, by changing relative magnitudes of the aforementioned applied voltages. In some embodiments, the source-side and drain-side of the charge-trapping stack 106A are programmed together.

The storage capacity of the SG-TFS memory cell 100A is proportional to the area density of DSEs 108A within the charge-trapping stack 106A, while device performance is driven by uniformity in dimension and spatial distribution of the DSEs 108A. In some embodiments, the SG-TFS memory cell 100A achieves a DSE size and minimum space below the lower limit of that which is achievable by some prior art optical lithography techniques.

Figure 1B:
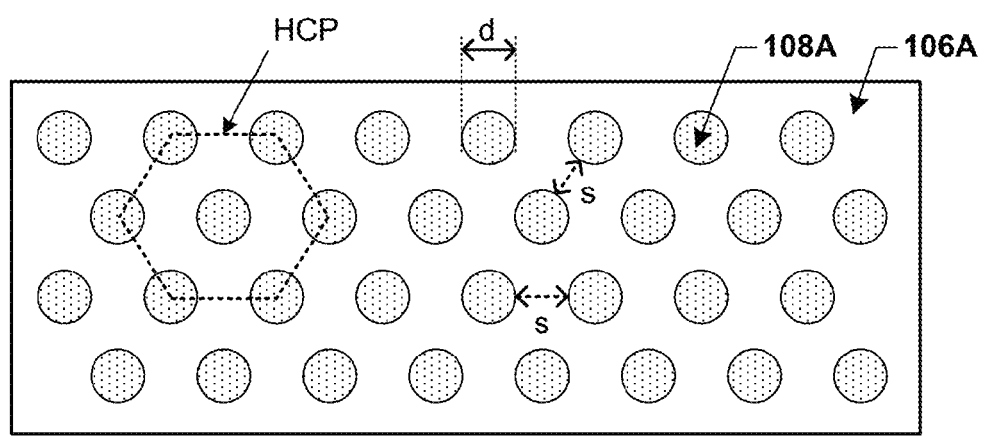

FIG. 1B illustrates a top-down view 100B of a pattern of DSEs 108A within the charge-trapping stack 106A the SG-TFS memory cell 100A. For the embodiments of FIGS. 1A-1B, the DSEs 108A configured in a periodic hexagonal close-packed (HCP) arrangement, and comprise a diameter (d) and minimum space (s) of less than 40 nm.

Figure 2A:
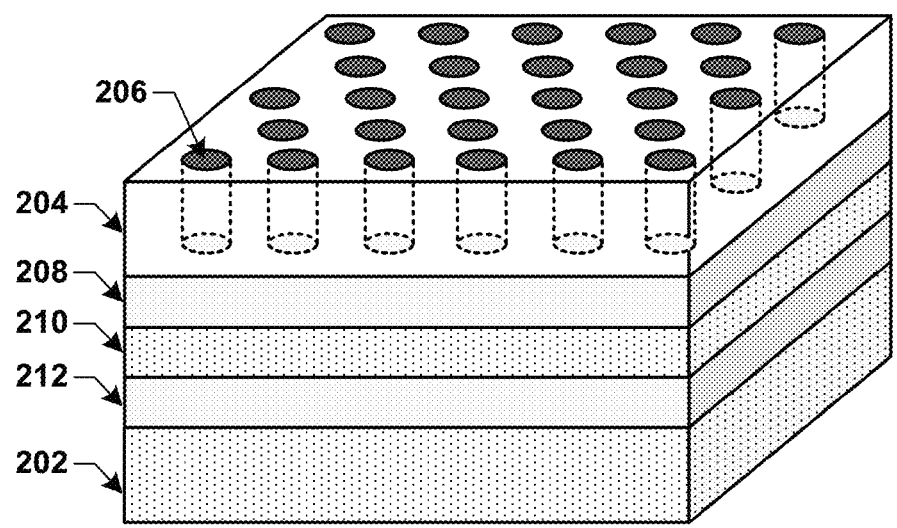
FIGS. 2A-2E illustrate cut out views of some embodiments of DSE patterning within a charge-trapping stack of the SG-TFS memory cell.

FIG. 2A illustrates some embodiments of a heterostructure 200A utilized for patterning the charge-trapping stack 106A. The heterostructure 200A comprises a substrate 202 (e.g., Si). A patterning stack resides above the substrate 202, and comprises a polymer matrix 204 comprising a pattern of first holes 206, disposed above a first dielectric layer 208 (e.g., $SiO_2$). The polymer matrix 204 comprises a cylindrical phase block copolymer thin film comprising two polymer species, wherein one of the species has been removed to form the pattern of first holes 206.

The patterning stack further comprises a seed layer 210 of substrate material formed over a second dielectric layer 212 (e.g., $SiO_2$). In some embodiments, the polymer matrix 204 comprises a thickness of less than 1,000 angstroms, and the first and second dielectric layers 208, 212 and the seed layer 210 each comprise a thickness of less than 100 angstroms. Formation of the polymer matrix 204 will be described in greater detail in the embodiments of FIGS. 4A-4C.

Figure 2B:
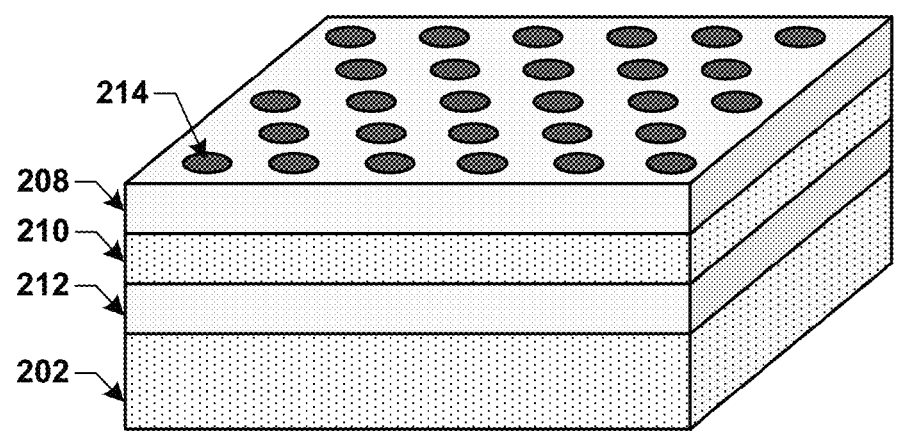

FIG. 2B illustrates some embodiments of a heterostructure 200B comprising the heterostructure 200A, wherein the first holes 206 of the polymer matrix 204 have been etched through while using the polymer matrix 204 as a hard mask (HM) to block etching outside of the first holes 206. The etching forms a pattern of second holes 214 in the first dielectric layer 208 and exposes a top surface of the seed layer 210 within each of the second holes 214. The pattern of second holes 214 is substantially identical to the pattern of first holes 206 (i.e., HCP). The polymer matrix 204 is then removed by an etch process such as a reactive ion etch (RIE) or other process.

Figure 2C:
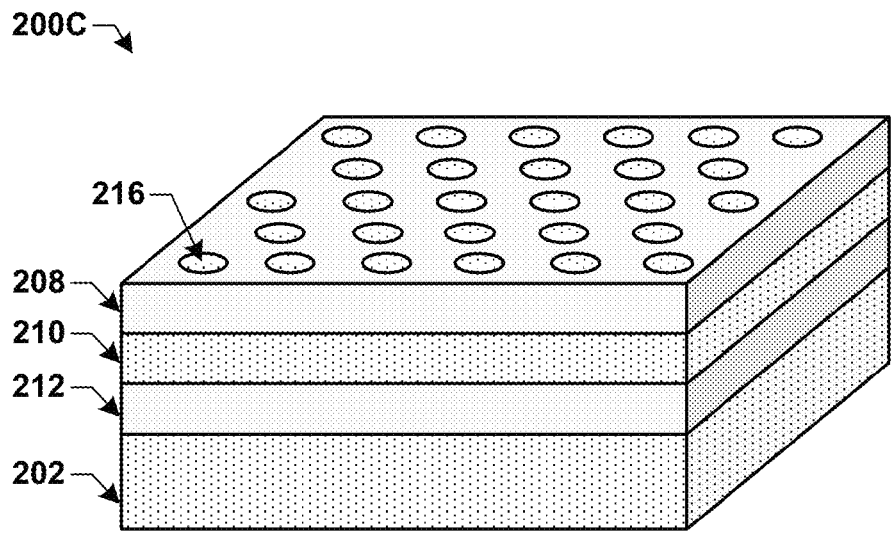

FIG. 2C illustrates some embodiments of a heterostructure 200C comprising the heterostructure 200B, wherein substrate material is epitaxially deposited onto the exposed surface of the seed layer 210 within the second holes 214, resulting in single or polycrystalline growth of substrate material (e.g., Si-NCs) within the second holes 214 to form DSEs 216.

In some embodiments, the epitaxial deposition of the DSEs 216 comprises chemical vapor deposition (CVD), or derivative CVD processes further comprise low pressure CVD (LPCVD), atomic layer CVD (ALCVD), ultrahigh vacuum CVD (UHVCVD), reduced pressure CVD (RPCVD), or any combinations thereof. In some embodiments, the epitaxial deposition of the DSEs 216 comprises a selective epitaxial growth (SEG) process further comprising simultaneous deposition and etch of substrate material. The SEG process is a selective deposition process, wherein crystalline and amorphous material is deposited within the second holes 214, and the heterostructure 200C is simultaneously exposed to a selective etchant (e.g., chlorine, hydrogen chloride, etc.) configured to remove the amorphous portions while leaving the crystalline portions substantially intact. The SEG process can enhance the crystalline quality of the DSEs 216 over some other epitaxial growth methods.

Figure 2D:
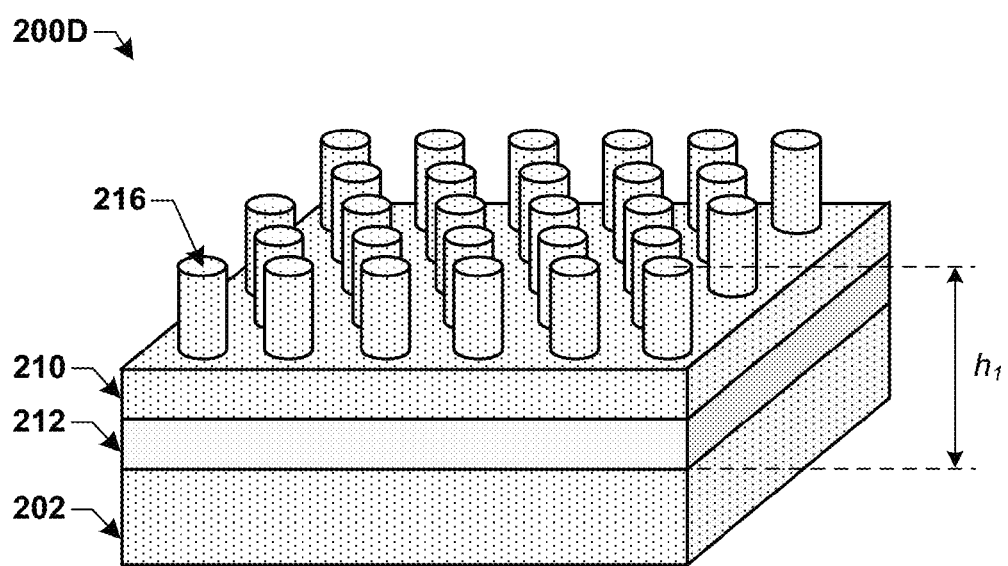

FIG. 2D illustrates some embodiments of a heterostructure 200D comprising the heterostructure 200C, wherein the first dielectric layer 208 is removed through a selective etch process. In some embodiments, the selective etch process comprises a wet etch configured to selectively remove amorphous $SiO_2$ (i.e., an $SiO_2$ matrix) while leaving crystalline the Si DSEs 216 intact. The selective removal of the first dielectric layer 208 leaves a contiguous layer of substrate material comprising the epitaxially deposited DSEs 216 and the seed layer 210, both comprising the substrate material.

Figure 2E:
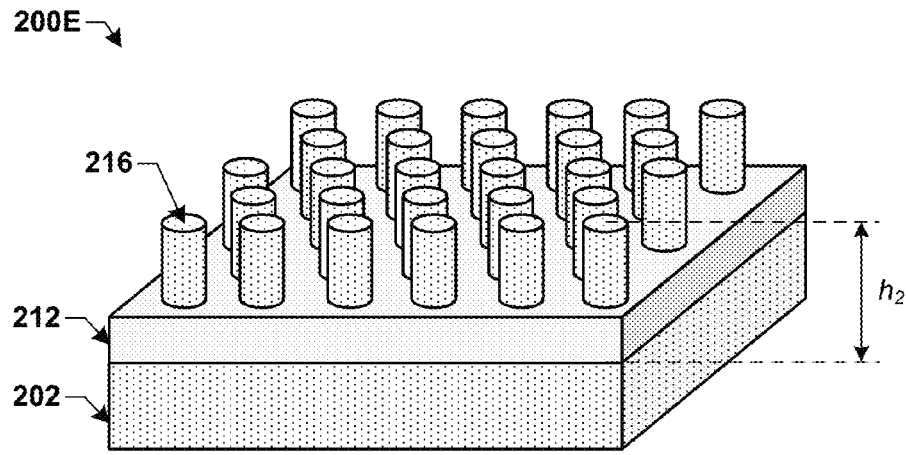

Upon removal of the first dielectric layer 208, the contiguous layer comprising the DSEs 216 and the seed layer 210 is subjected to an etch (e.g., a dry etch), which removes the substrate material uniformly across the surface, resulting in the complete removal of the seed layer 210 not below a DSE 216, and a reduction in height of the DSEs 216 over the remaining portions of the seed layer 210, relative to the surface of the substrate from $h_2$ (about 200 angstroms) to $h_1$ (about 100 angstroms) as illustrated in heterostructure 200E in the embodiments of FIG. 2E. For the embodiments of FIG. 2E, the remaining DSEs 216 are isolated from one another and form a regular pattern. In some embodiments, a DSE 216 comprises a cylindrical shape and a height of less than 100 angstroms. In some embodiments, the DSEs 216 comprise an HCP pattern, wherein each DSE 216 comprises a diameter and minimum space of less than 40 nm, this achieving a higher area density than some aforementioned prior art methods of optical lithography.

Figure 3:
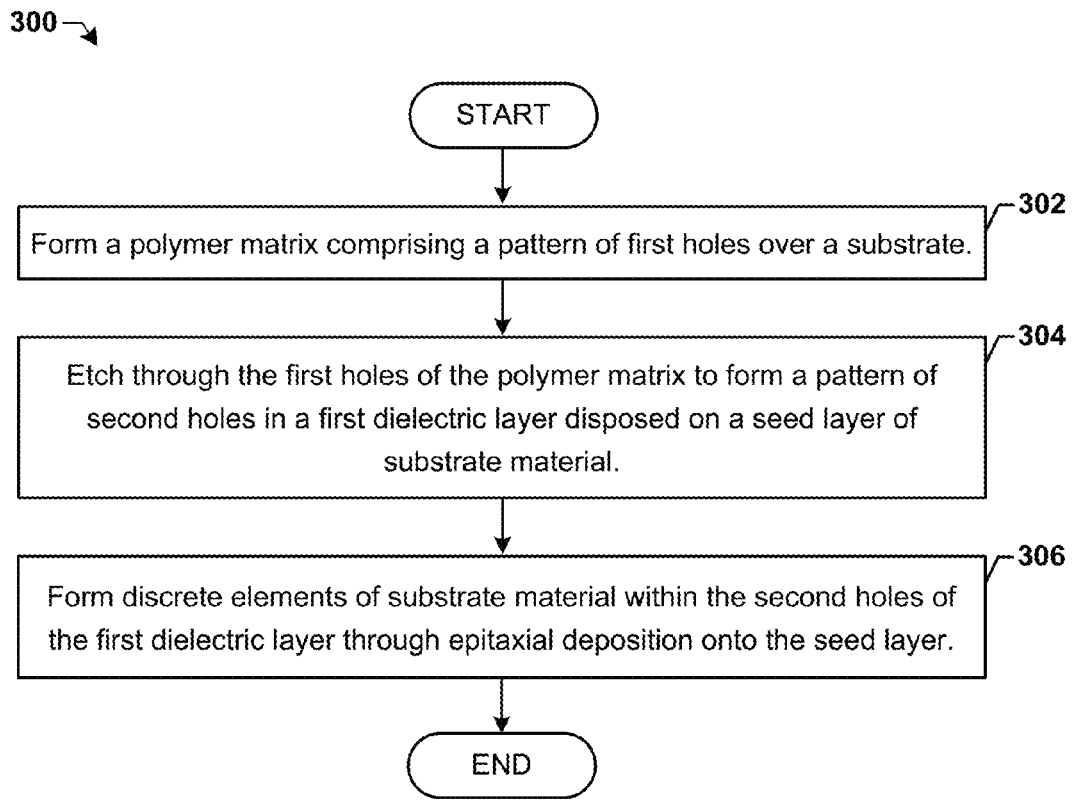
FIG. 3 illustrates some embodiments of a method of forming DSEs within a memory device.

FIG. 3 illustrates some embodiments of a method 300 of forming DSEs within a memory device. While method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302 a polymer matrix comprising a pattern of first holes is formed over a substrate. In some embodiments, formation of the polymer matrix comprises spin-coating the substrate with a copolymer solution comprising first and second polymer species. The substrate is then annealed which results in a self-assembly of the copolymer solution into a phase-separated material, wherein the first polymer species forms a polymer matrix, and the second polymer species forms a pattern of micro-domains within the polymer matrix. The second polymer species is then removed with a selective etch process which leaves the polymer matrix intact, but replaces the pattern of micro-domains with a substantially identical pattern of the first holes within the polymer matrix.

At 304 an etch is performed which utilizes the polymer matrix as an HM. The etch comprises etching through the first holes of the polymer matrix to form a pattern of second holes in a first dielectric layer disposed on a seed layer of substrate material. In some embodiments, removal of the second polymer species comprises an oxygen RIE.

At 306 DSE of substrate material are formed within the second holes of the first dielectric layer through epitaxial deposition of substrate material onto the seed layer. In some embodiments, the epitaxial deposition comprises chemical vapor deposition (CVD) or selective epitaxial growth (SEG) of silicon-containing source vapor onto an Si seed layer.

Figure 4A:
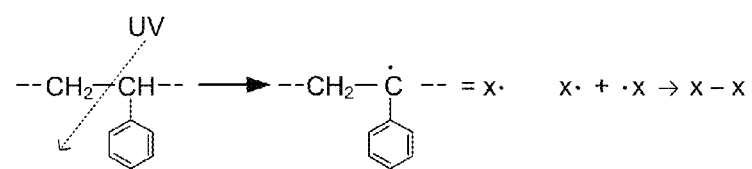
FIGS. 4A-4C illustrate some embodiments of direct self-assembly (DSA) of first and second polymer species within a copolymer solution as a function of volume fraction.
Figure 4B:
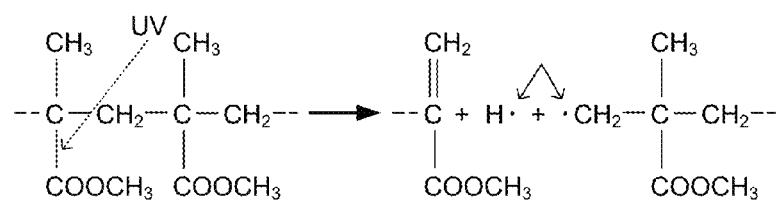

In some embodiments, the copolymer solution comprises poly(styrene-block-methylmethacrylate) (PS-b-PMMA), wherein the first polymer species comprises poly(methyl methacrylate) (PMMA), and the second polymer species comprises polystyrene (PS). In some embodiments, the PS-b-PMMA copolymer is spin-coated onto a substrate, and promoted to self-assemble by thermal annealing or by solvent annealing an inert atmosphere, to achieve a cylindrical phase block copolymer film, wherein the PS forms the polymer matrix, and the PMMA forms the pattern of self-assembled cylindrical micro-domains oriented parallel the surface of the substrate. The copolymer film is then irradiated with ultraviolet (UV) radiation, which promotes cross-linking of the PS molecules through the removal of one hydrogen from a benzene-bonded carbon of the PS polymer chain, such that two PS polymer units 400A or chains of such ionized units may cross-link, as illustrated in FIG. 4A. The UV radiation simultaneously degrades the PMMA polymer unit 400B through the removal of one hydrogen from a methylidene molecule ($CH_2$) bonded to two carbons of the PMMA polymer unit 400B, as illustrated in FIG. 4B. After UV irradiation, the PMMA may be removed through an oxygen (e.g., $O_2$ plasma) RIE.

Figure 4C:
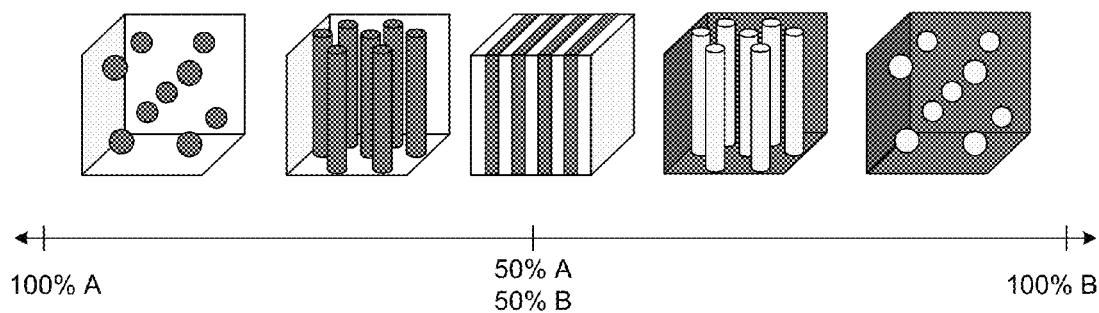

In various embodiments, the PMMA may form the micro-domains within the PS matrix, or the PMMA may form the matrix comprising PS micro-domains. FIG. 4C, illustrates some embodiments of various morphologies 400C of the first and second polymer species, A, B as a function of relative volume fraction. For a nearly equal volume fraction of the first and second polymer species A, B in an equilibrium configuration, a lamellar (layered) copolymer structure is formed. Cylindrical micro-domain structures are formed as the volume fraction of species A or B is decreased relative to species B or A. Spherical micro-domains form when the volume fraction of species A or B is further decreased relative to species B or A. The values of volume fractions that achieve these volume-fraction-dependent morphologies are dependent upon the conditions under which the copolymer was formed (e.g., the annealing conditions) as well as the types of first and second polymer species A, B. For the embodiments of FIGS. 2A-2C and FIG. 3, the polymer matrix 204 comprises PS, and the cylindrical micro-domains comprise PMMA which is removed to form the first holes 206.

Figure 5A:
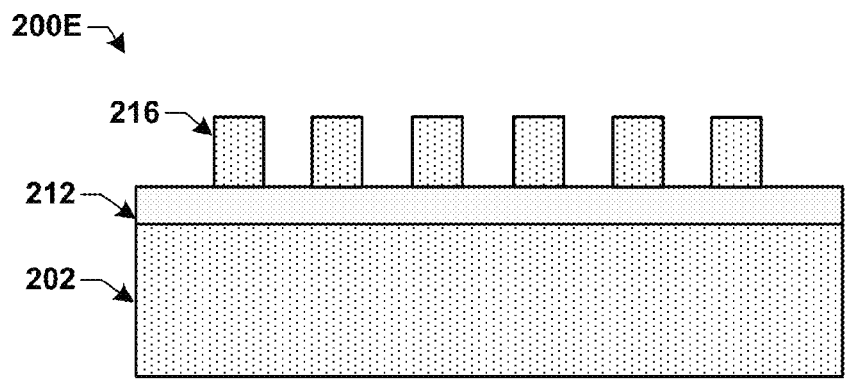
FIGS. 5A-5E illustrate cross-sectional views of some embodiments of memory cell formation by control gate first.
Figure 5B:
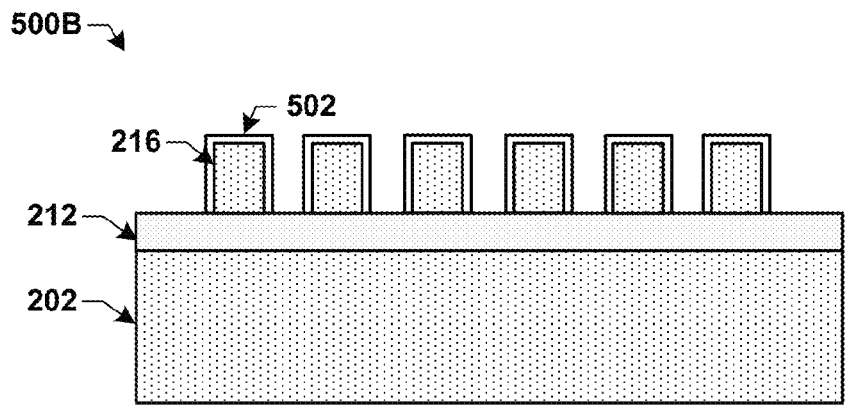

FIGS. 5A-5E illustrate cross-sectional views of some embodiments of SG-TFS memory cell formation by control gate (CG) first. FIG. 5A illustrates a cross-sectional view of the heterostructure 200E formed in the embodiments of FIGS. 2A-2E. FIG. 5B illustrates a cross-sectional view of a heterostructure 500B, comprising heterostructure 200E wherein a protective layer 502 is disposed over the DSEs 216. In some embodiments, the protective layer 502 passivates the DSEs 216. In some embodiments, the protective layer 502 protects the DSEs 216 during subsequent processing steps. In some embodiments, the protective layer 502 comprises an oxide, a nitride, an oxynitride, or any combination thereof.

Figure 5C:
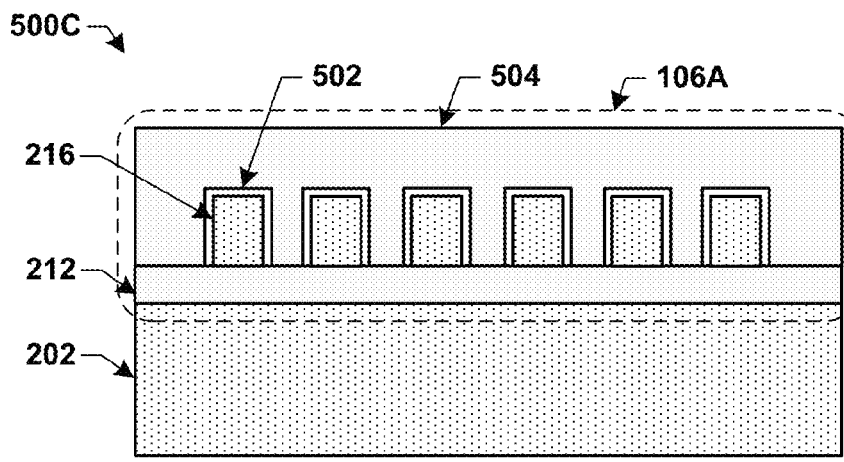

FIG. 5C illustrates a cross-sectional view of a heterostructure 500C, comprising heterostructure 500B wherein a third dielectric layer 504 is formed on the second dielectric layer 212, and surrounds the DSE 216. In some embodiments, the third dielectric layer 504 comprises $SiO_2$. In some embodiments, the third dielectric layer 504 is produced through thermal oxidation. The DSE 216 and second and third dielectric layers 212, 504 comprise the charge-trapping stack 106A of the embodiments of FIGS. 1A-1B.

Figure 5D:
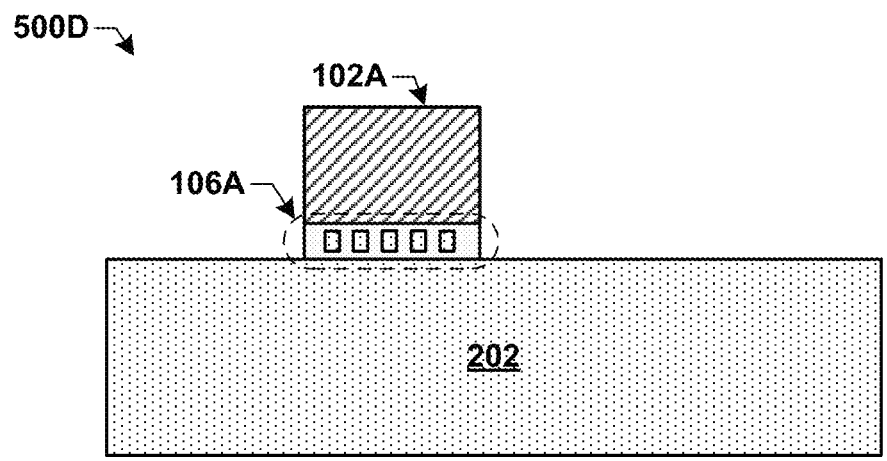

FIG. 5D illustrates a cross-sectional view of a heterostructure 500C, comprising heterostructure 500C wherein the CG electrode 102A is disposed above the charge-trapping stack 106A. Disposal of the CG electrode 102A comprises deposition of a conductive layer surface of the substrate 202, which is then patterned and etched to form the CG electrode 102A. The CG electrode 102A is configured to control the flow of charges into and out of the charge-trapping stack 106A. In some embodiments, CG electrode 102A comprises a conductive material such as a metal, a metal alloy, a metal compound, a doped semiconductor material (e.g. polysilicon), or any combination thereof.

Figure 5E:
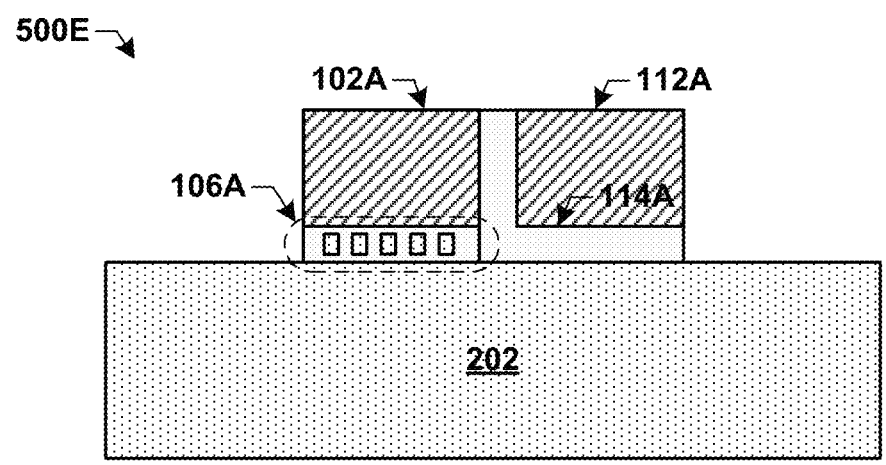

FIG. 5E illustrates a cross-sectional view of a heterostructure 500E, comprising heterostructure 500D wherein a fourth dielectric layer (114A) is disposed over the CG electrode 102A and surface of the substrate 202. The SG electrode 112A is then disposed adjacent the CG electrode 102A by a pattern and etch process. In some embodiments, SG electrode 112A comprises a conductive material such as a metal, a metal alloy, a metal compound, a doped semiconductor material (e.g. polysilicon), or any combination thereof.

Upon formation of the SG electrode 112A, the source 116A and drain 118A of the embodiments of FIGS. 1A-1B are defined, the ILD 120A is formed, and first and second contacts 122A, 124A are formed from the source and drain 116A, 118A to first and second wiring levels 126A, 128A to produce the SG-TFS memory cell 100A.

Figure 6A:
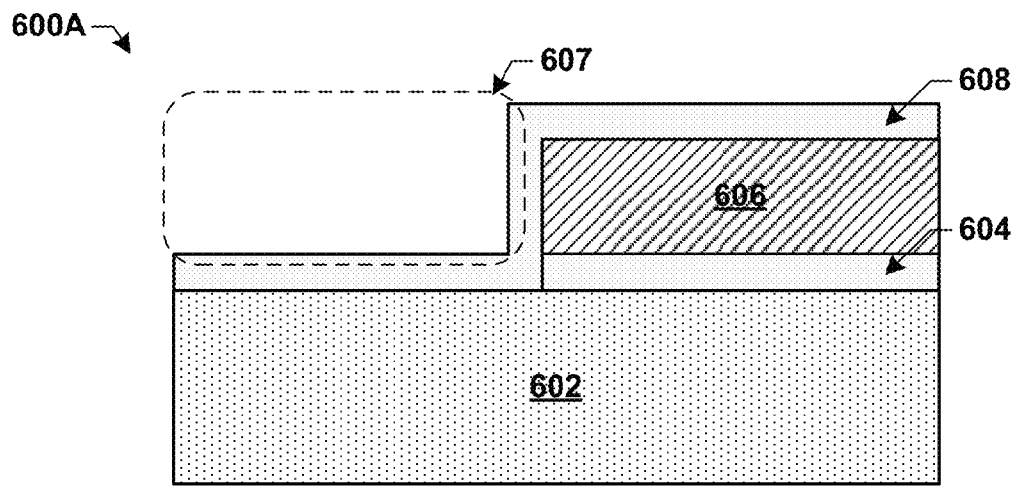
FIGS. 6A-6D illustrate cross-sectional views of some embodiments of memory cell formation by select gate first.

In some embodiments, a memory cell which is equivalent to the SG-TFS memory cell 100A may be produced by other means. FIGS. 6A-6D illustrate cross-sectional views of some embodiments of memory cell formation by select gate (SG) first. FIG. 6A illustrates a cross-sectional view of a heterostructure 600A formed on a substrate 602 (e.g., Si or SOI), wherein a first dielectric layer 604 (e.g., $SiO_2$) is disposed above the substrate 602, and a first conductive layer 606 (e.g., metal, semiconductor, etc.) is disposed, patterned, and etched over a region 607 expose the surface of the substrate within the region 607. A second dielectric layer 608 is then disposed over the patterned substrate 602.

Figure 6B:
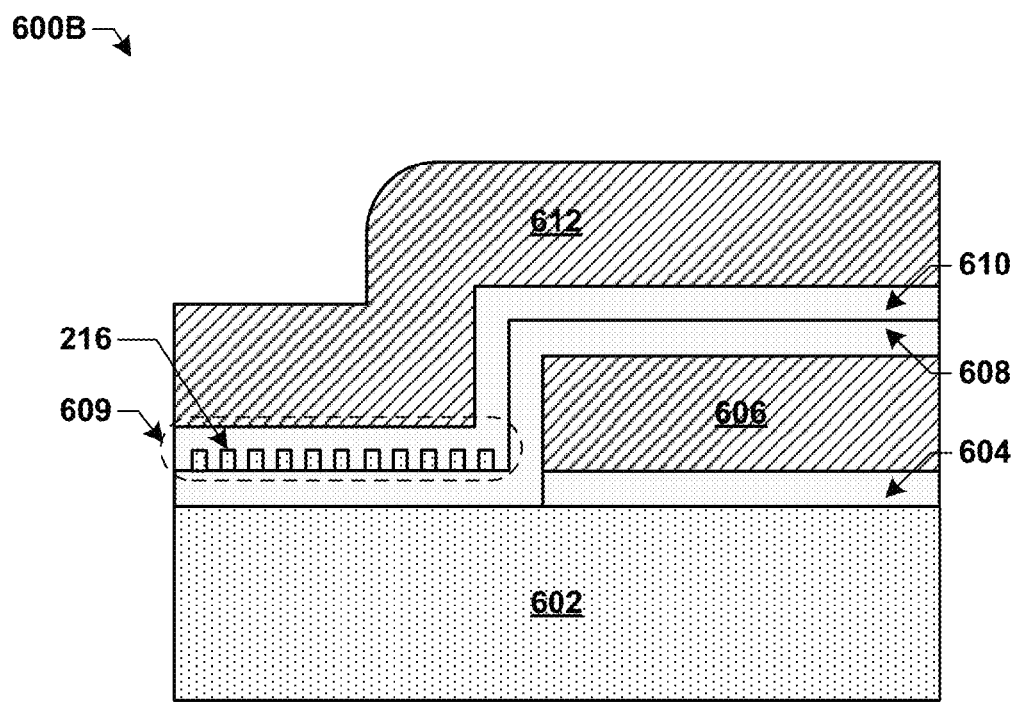

FIG. 6B illustrates a cross-sectional view of a heterostructure 600B, comprising heterostructure 600A wherein a pattern of DSEs 216 is formed in a manner described in the embodiments of FIGS. 2A-2E, and coated with a protective layer (e.g., oxide, nitride, etc., not shown). A third dielectric layer 610 is then disposed over the heterostructure 600B, encapsulating the pattern of DSEs 216 to form a charge-trapping stack 609. A second conductive layer 612 (e.g., metal, semiconductor, etc.) is then disposed over the third dielectric layer 610.

Figure 6C:
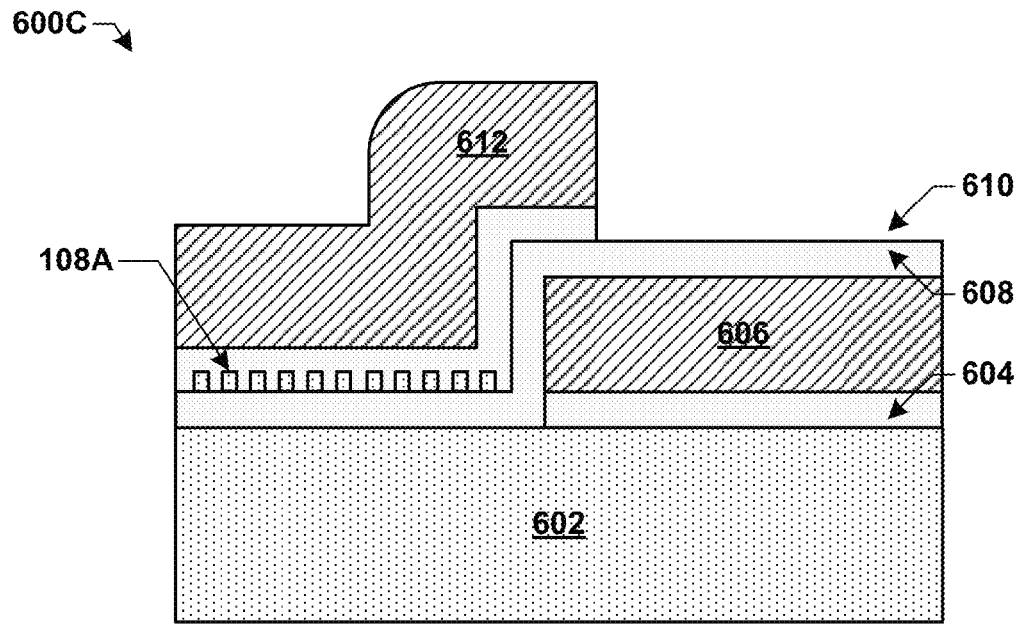
Figure 6D:
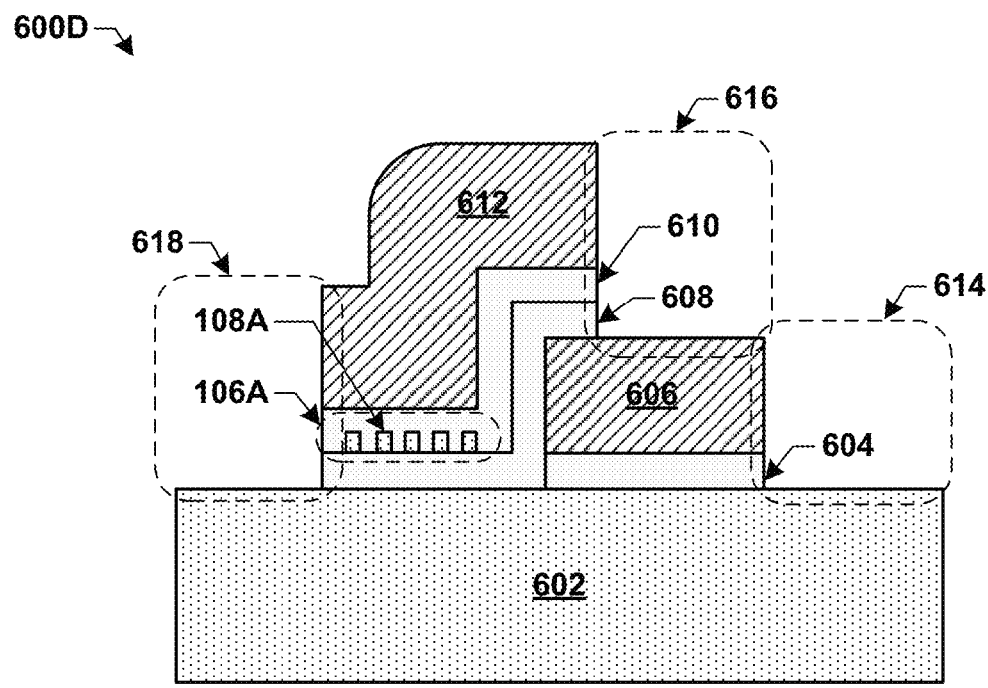

FIG. 6C illustrates a cross-sectional view of a heterostructure 600C, comprising heterostructure 600B wherein a pattern and etch step is performed to remove a portion of the second conductive layer 612 over the first conductive layer 606. FIG. 6D illustrates a cross-sectional view of a heterostructure 600D, comprising heterostructure 600C wherein a first additional pattern and etch step has been performed to remove a portion of the first conductive layer 606 and first dielectric layer 604 over a source region 614. A second additional pattern and etch step has been performed remove a portion of the second and third dielectric layers 608, 610 above the first conductive layer 606 in a region 616, resulting in the formation of an SG electrode. And, a third additional pattern and etch step has been performed remove portions of the second conductive layer 612, and second and third dielectric layers 608, 610 over a drain region 618.

The embodiments of FIG. 6D define a split-gate structure, which can be further processed to form source and drain regions through an implant or other process, form an ILD, and form contacts to the source and drain regions as well as to the first and second conductive layers 606, 612.

Figure 7:
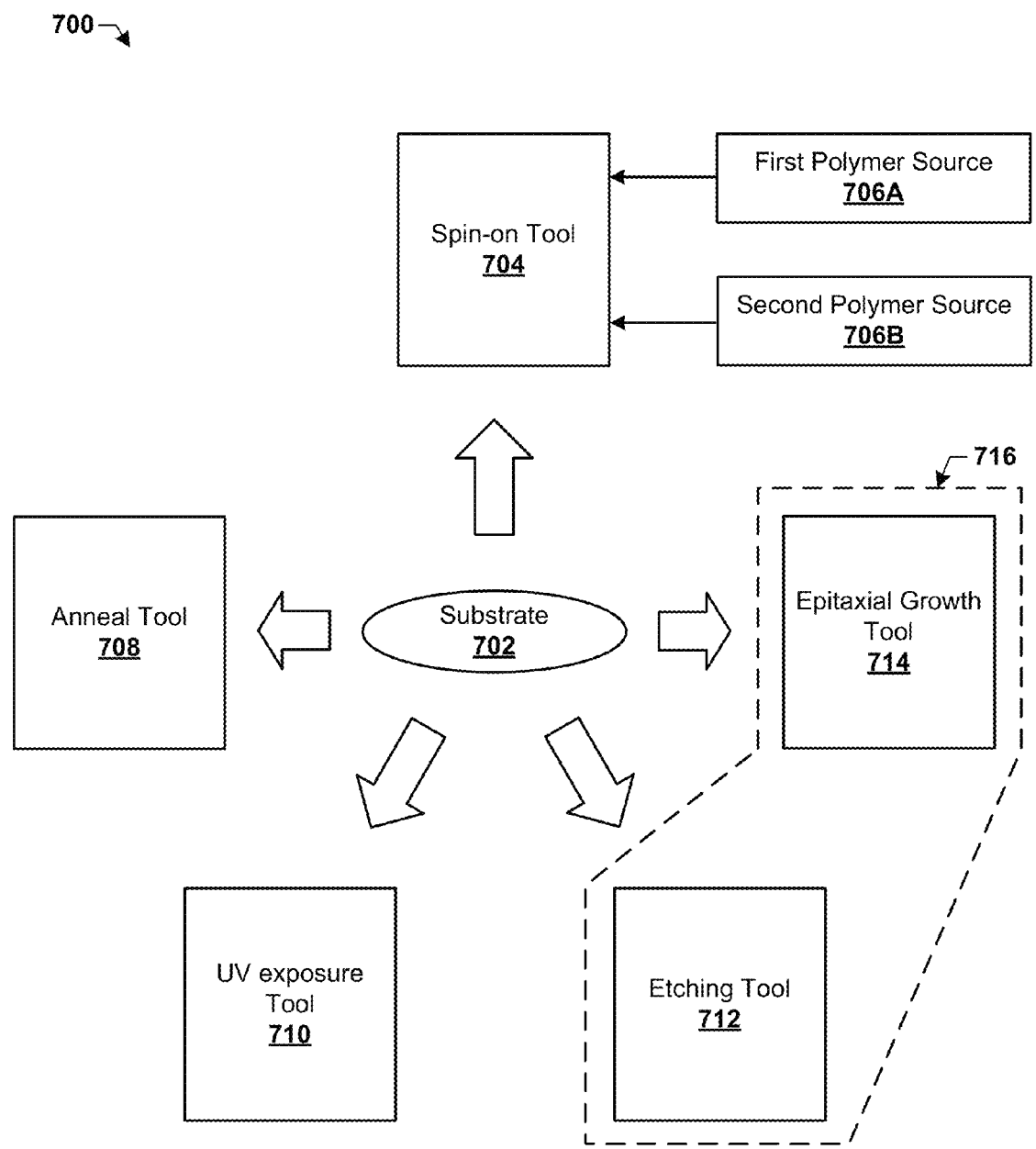
FIG. 7 illustrates some embodiments of a tool arrangement configured manufacture a memory cell comprising a pattern of DSEs.

FIG. 7 illustrates some embodiments of a tool arrangement 700 configured manufacture a memory cell comprising a pattern of DSEs on a substrate 702. The tool arrangement 700 comprises a spin-on tool 704 configured to receive first and second polymer species 706A, 706B, and spin-coat the substrate with a copolymer solution comprising the first and second polymer species 706A, 706B. The tool arrangement 700 further comprises an anneal tool 708. In some embodiments, the anneal tool 708 comprises an oven configured to subject the substrate 702 thermal annealing. In some embodiments, the anneal tool 708 comprises a solvent annealing tool configured to subject the substrate 702 to an inert atmosphere (e.g., argon, etc.). The anneal tool 708 is configured to achieve DSA of the copolymer film into a polymer matrix comprising the first or second polymer species 706A, 706B occupied by micro-domains comprising the second or first polymer species 706B, 706A, respectively.

The tool arrangement 700 further comprises a UV exposure tool 710 configured to provide UV radiation to the substrate 702. In some embodiments, the UV radiation results in cross-linking of units of the first or second polymer species 706A, 706B, while simultaneously degrading linkage between units of the second or first polymer species 706B, 706A, respectively.

The tool arrangement 700 further comprises an etching tool 712. In some embodiments, the etching tool 712 is configured to subject the substrate 702 to a RIE process (e.g., $O_2$ plasma RIE) to remove the first or second polymer species 706A, 706B from the polymer matrix. In some embodiments, the etching tool 712 is configured to subject the substrate 702 to a dry etch for DSE patterning while utilizing polymer matrix as an HM. In some embodiments, the etching tool 712 is configured to expose the substrate 702 to a continuous flow of one or more dry etchants, wet etchants, or a combination of both. In some embodiments, the etching tool 712 is configured to utilize vapor etchants such as halide gases comprising chlorine $Cl_2$ or hydrogen chloride HCl to perform a selective etch of amorphous or polycrystalline material, while leaving crystalline portions relatively intact. In some embodiments, the etching tool 712 is configured to subject the substrate 702 to etchants such as carbon tetrafluoride (CF4), HF, tetramethylammonium hydroxide (TMAH), or combinations of thereof, for anisotropic etching.

The tool arrangement 700 further comprises an epitaxial growth tool 714. In some embodiments, the epitaxial growth tool 714 comprises a CVD tool, a physical vapor deposition (PVD) tool, electrodeposition tool, or other epitaxial tool such as a sputtering tool, a vapor phase epitaxy (VPE) tool, etc., configured to grow DSEs of substrate material within holes of the polymer matrix disposed over the substrate 702. In some embodiments, the epitaxial growth tool 714 and the etching tool 712 are combined in a single processing chamber 716 to achieve SEG of DSEs on the substrate, wherein crystal quality and the etch rate of the SEG process be altered by adjusting a temperature or partial pressure of one or more vapor etchants, or the temperature within the processing chamber. In some embodiments, the single processing chamber 716 comprises a vacuum or ultra-low vacuum (UHV) chamber.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, some embodiments of the present disclosure relate to a method that achieves a substantially uniform pattern of discrete storage elements within a memory cell. A copolymer solution comprising first and second polymer species is spin-coated onto a surface of a substrate and subjected to self-assembly into a phase-separated material comprising a regular pattern of micro-domains of the second polymer species within a polymer matrix comprising the first polymer species. The second polymer species is then removed resulting with a pattern of holes within the polymer matrix. An etch is then performed through the holes utilizing the polymer matrix as a hard-mask to form a substantially identical pattern of holes in a dielectric layer disposed over a seed layer disposed over the substrate surface. Epitaxial deposition onto the seed layer then utilized to grow a substantially uniform pattern of DSEs within the dielectric layer.

In some embodiments, the present disclosure relates to a memory device comprising a semiconductor substrate, and a first dielectric layer disposed over the semiconductor substrate. The memory device further comprises a plurality of quantum dots disposed onto and in direct contact with the first dielectric layer. The plurality of quantum dots have substantially cylindrical shapes that have a greater height than a diameter.

In other embodiments, the present disclosure relates to a memory device comprising a semiconductor substrate, and a first silicon dioxide layer disposed over the semiconductor substrate. The memory device further comprises a plurality of silicon dots having cylindrical shapes with substantially the same size. The plurality of silicon dots are disposed onto and in direct contact with the first silicon dioxide layer in a pattern having a substantially uniform space between adjacent ones of the plurality of silicon dots.

In yet other embodiments, the present disclosure relates to a memory device comprising a first dielectric layer disposed over a semiconductor substrate. The memory device further comprises a plurality of silicon dots disposed onto and in direct contact with the first dielectric layer. The plurality of silicon dots have substantially cylindrical shapes that have a greater height than a diameter. The memory device further comprises a second dielectric layer located on the first dielectric layer and surrounding the plurality of silicon dots. The memory device further comprises a control gate electrode disposed over the plurality of silicon dots, and a select gate electrode laterally separated from the control gate electrode and vertically separated from the semiconductor substrate the by a third dielectric layer. The memory device further comprises a protective layer arranged between the plurality of silicon dots and the second dielectric layer.

What is claimed is:

1. A memory device, comprising:
a semiconductor substrate;
a first dielectric layer disposed over the semiconductor substrate;
a plurality of quantum dots disposed onto and in direct contact with the first dielectric layer, wherein the plurality of quantum dots have substantially cylindrical shapes;
a second dielectric layer that is arranged vertically over the plurality of quantum dots, and that abuts an upper surface of the first dielectric layer; and
a protective layer that separates the plurality of quantum dots from the second dielectric layer.

2. The memory device of claim 1, wherein the plurality of quantum dots are disposed onto the first dielectric layer in a pattern having a substantially uniform spacing between adjacent quantum dots.

3. The memory device of claim 1, wherein the plurality of quantum dots are disposed onto the first dielectric layer in a hexagonal close-packed arrangement.

4. The memory device of claim 1, wherein diameters of the substantially cylindrical shapes are less than or equal to approximately 40 nm.

5. The memory device of claim 4, wherein adjacent ones of the plurality of quantum dots are separated by a substantially uniform space of less than or equal to approximately 40 nm.

6. The memory device of claim 1, wherein the plurality of quantum dots comprise silicon.

7. The memory device of claim 1, wherein heights of the substantially cylindrical shapes are less than or equal to approximately 100 angstroms.

8. The memory device of claim 1, wherein the semiconductor substrate comprises silicon, and the first dielectric layer and the second dielectric layer comprise silicon dioxide.

9. The memory device of claim 1, further comprising:
a control gate electrode disposed over the semiconductor substrate; and
a select gate electrode laterally separated from the control gate electrode and vertically separated from the semiconductor substrate by a third dielectric layer.

10. The memory device of claim 1, wherein the substantially cylindrical shapes respectively have a height and a diameter, wherein the height is greater than the diameter.

11. A memory device, comprising:
a semiconductor substrate;
a first silicon dioxide layer disposed over the semiconductor substrate;
a plurality of silicon dots having cylindrical shapes, which are disposed onto and in direct contact with the first silicon dioxide layer in a pattern having a substantially uniform space between adjacent silicon dots, wherein the plurality of silicon dots have substantially the same size as one another;
a protective layer arranged over the plurality of silicon dots; and
a second silicon dioxide layer located on the first silicon dioxide layer and surrounding the plurality of silicon dots.

12. The memory device of claim 11,
wherein the plurality of silicon dots respectively have a plurality of diameters, respectively, with the diameters each being less than or equal to approximately 40 nm; and
wherein the adjacent silicon dots are separated by the substantially uniform space, which is less than or equal to approximately 40 nm.

13. The memory device of claim 11, wherein the plurality of silicon dots are disposed onto the first silicon dioxide layer in a hexagonal close-packed arrangement.

14. The memory device of claim 11, wherein a height of the cylindrical shapes is less than or equal to a diameter of the cylindrical shapes.

15. The memory device of claim 11, further comprising:
a control gate electrode disposed over the plurality of silicon dots; and
a select gate electrode laterally separated from the control gate electrode and vertically separated from the semiconductor substrate by a third silicon dioxide layer.

16. A memory device, comprising:
a first dielectric layer disposed over a semiconductor substrate;
a plurality of silicon dots disposed onto and in direct contact with the first dielectric layer, wherein the plurality of silicon dots have substantially cylindrical shapes;
a second dielectric layer located on the first dielectric layer and surrounding the plurality of silicon dots;
a control gate electrode disposed over the plurality of silicon dots;
a select gate electrode laterally separated from the control gate electrode and vertically separated from the semiconductor substrate by a third dielectric layer; and
a protective layer arranged between the plurality of silicon dots and the second dielectric layer.

17. The memory device of claim 16, wherein the plurality of silicon dots are disposed onto the first dielectric layer in a pattern having a substantially uniform spacing between adjacent ones of the plurality of silicon dots.

18. The memory device of claim 16, wherein the plurality of silicon dots are disposed onto the first dielectric layer in a pattern that is a hexagonal close-packed arrangement.

19. The memory device of claim 16,
wherein diameters of the substantially cylindrical shapes are less than or equal to approximately 40 nm; and wherein height of the substantially cylindrical shapes are less than or equal to approximately 100 angstroms.

20. The memory device of claim 16, wherein the substantially cylindrical shapes respectively have a greater height than a diameter.

* * * * *